US005372953A

United States Patent [19]

Matsuoka

[11] Patent Number: 5,372,953

[45] Date of Patent: Dec. 13, 1994

[54] METHOD OF MANUFACTURING A BIPOLAR TRANSISTOR INCLUDED IN AN INTEGRATED CIRCUIT HAVING NO FIELD OXIDE FILM BETWEEN A P-TYPE REGION AND ITS ELECTRODE

[75] Inventor: Akio Matsuoka, Tokyo, Japan

[73] Assignee: NEC Corporation, Tokyo, Japan

[21] Appl. No.: 20,543

[22] Filed: Feb. 22, 1993

[30] Foreign Application Priority Data

Feb. 20, 1992 [JP] Japan .................................. 4-032496

[51] Int. Cl.$^5$ .......................................... H01L 21/265

[52] U.S. Cl. ....................................... 437/31; 437/28; 437/240; 437/236; 148/DIG. 10; 148/DIG. 17

[58] Field of Search ...................... 437/31, 24, 25, 27, 437/28, 236, 240; 148/DIG. 10, DIG. 17

[56] References Cited

U.S. PATENT DOCUMENTS 5,244,821 9/1993 Ham et al. ............................ 437/28

*Primary Examiner*—Tom Thomas
*Assistant Examiner*—Tuan Nguyen
*Attorney, Agent, or Firm*—Sughrue, Mion, Zinn, Macpeak & Seas

[57] ABSTRACT

As an element of an integrated circuit, an npn bipolar transistor is manufactured as usual in a transistor area covered on a semeconductor substrate with a portion of a field oxide layer by forming openings through the layer portion and forming a highly n-doped collector lead, a highly p-doped base contact region, and then a highly n-doped emitter region. A field oxide film unavoidably remains at a bottom of one of the openings that is directed to the base contact region. This is because p-type impurity ions are injected through the field oxide film on forming the base contact region. Either by thermal oxdization or by injection of oxygen ions, the field oxide film is given a high or excessive oxygen content. It now becomes possible to completely remove the field oxide film by chemical etch, as by hydrofluoric acid, and to bring an electrode into execellent ohmic contact with the base contact region. This method is equally well applicable to manufacture of a pnp bipolar transistor in completely removing field oxide films which inevitably remain in the openings directed to highly p-doped collector lead and emitter region.

9 Claims, 3 Drawing Sheets

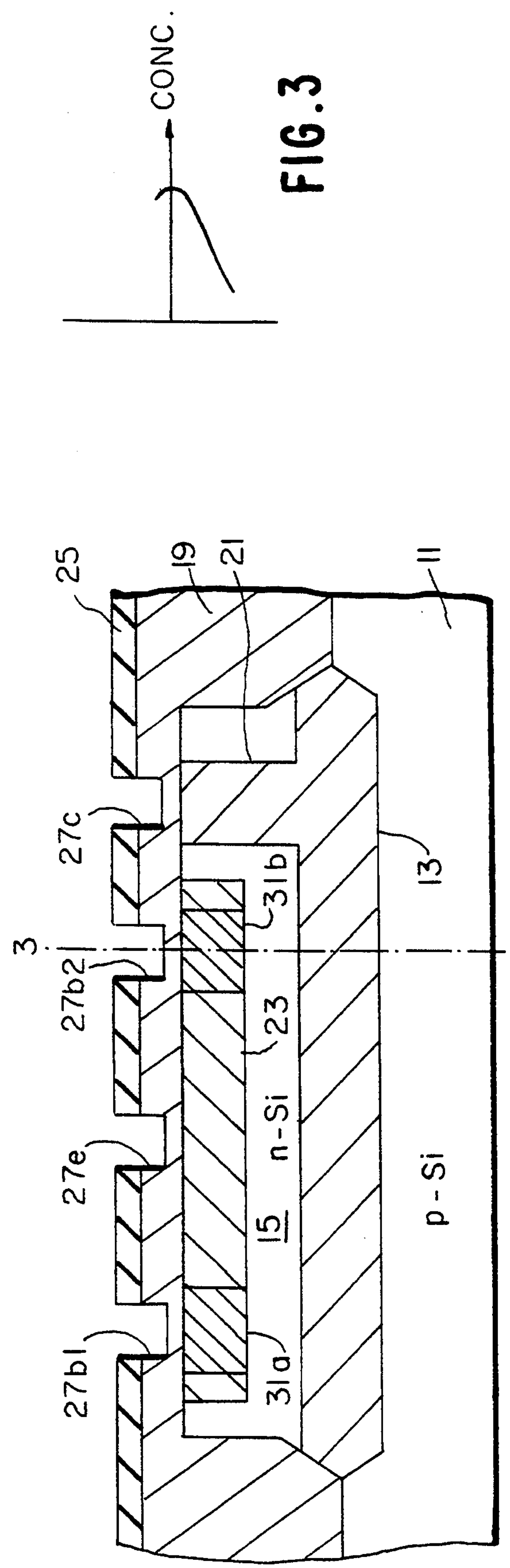
CONC.
FIG.3
25
19
21
11
27c
3
3
31b
13
27b2
23
n-Si
27e
p-Si
15
27b1
31a
FIG.2
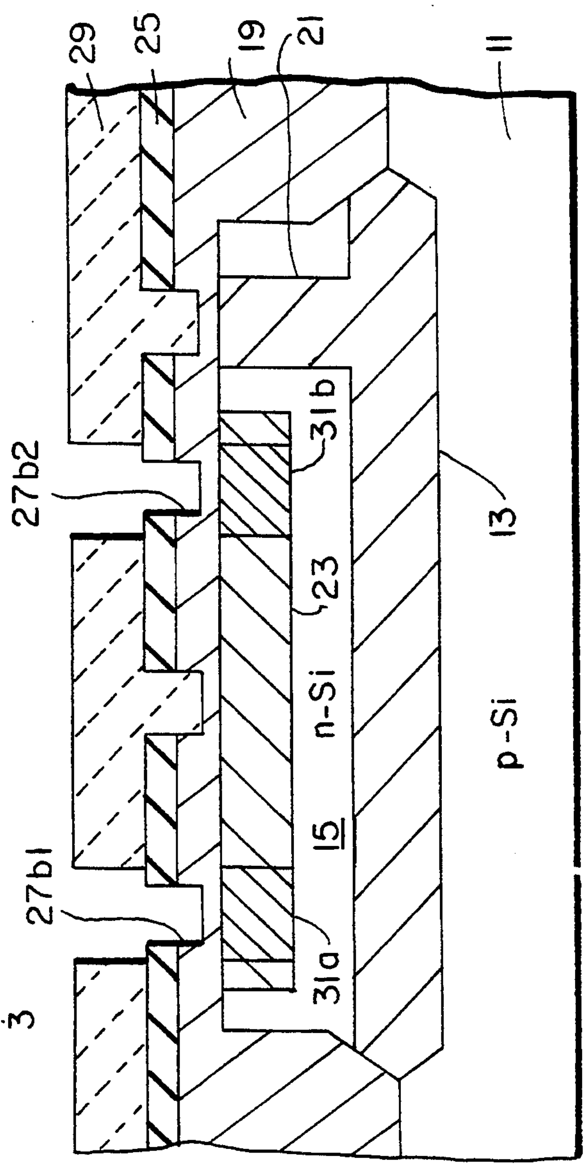
29
25
19
21
11
31b
27b2
13
23
n-Si
p-Si
15
27b1
31a
FIG.4

METHOD OF MANUFACTURING A BIPOLAR TRANSISTOR INCLUDED IN AN INTEGRATED CIRCUIT HAVING NO FIELD OXIDE FILM BETWEEN A P-TYPE REGION AND ITS ELECTRODE

BACKGROUND OF THE INVENTION:

This invention relates to a bipolar transistor of an integrated circuit (IC) and a method of manufacturing the same.

In an integrated circuit arranged on a semiconductor substrate given an n-type conductivity, such as an n-type silicon substrate, and having a principal surface, an npn bipolar transistor is manufactured along a transistor area surrounded on the principal surface by a field oxide layer which may be made of silicon dioxide and is alternatively called an element isolation layer in the art. The bipolar transistor comprises a highly p-doped base contact region, a highly n-doped emitter region, and a highly n-doped collector region.

In the manner which will later be described in greater detail, the collector region is manufactured as a buried layer under the transistor area. The field oxide layer is selectively formed. As a thin film, the field oxide layer covers the transistor area. Through the thin film, a base hole, an emitter hole, and a collector hole are selectively formed. A part of the thin film remains as a field oxide film in the base hole at its bottom. The base contact region is formed by ion injection of ions of a p-type impurity, such as boron ions, into the semiconductor substrate through the field oxide film. The emitter region is subsequently formed by ion injection. Later, the field oxide film is subjected to chemical removal or etch. Base, emitter, and collector electrodes are formed through the base, the emitter, and the collector holes.

It has been confirmed by the present inventor that the field oxide film is not completely removed by the chemical removal. This is because the field oxide film is highly doped with the p-type impurity during the ion injection to become a film of a compound consisting essentially of silicon and the p-type impurity. This film is herein called a silicon-boron (SiB) film. Due to presence of the silicon-boron film, the base electrode is not brought into an electrically excellent ohmic contact with the base contact region. As a consequence, the bipolar transistor has a forward voltage of higher than 1 volt and a forward voltage gain which is one of high frequency characteristics and is 11 through 13 dB.

SUMMARY OF THE INVENTION:

It is consequently an object of the present invention to provide a bipolar transistor which is formed as an element of an integrated circuit and includes no field oxide film between a p-type region and its electrode.

It is another object of this invention to provide a bipolar transistor which is of the type described and which has a reduced forward voltage.

It is still another object of this invention to provide a bipolar transistor which is of the type described and which has a raised forward voltage gain.

It is a further object of this invention to provide a method of manufacturing a bipolar transistor which is of the type described.

Other objects of this invention will become clear as the description proceeds.

On setting forth the gist of an aspect of this invention, it is possible to understand that a bipolar transistor is manufactured as an element of an integrated circuit along a semiconductor substrate having a principal surface to comprise a p-type region formed by injection, through an oxide film remaining along the principal surface, of p-type impurity ions into the semiconductor substrate.

In accordance with this aspect of the invention, the above-understood bipolar transistor comprises no oxide film between the p-type region and an electrode for the p-type region.

On setting forth the gist of a different aspect of this invention, it is possible to understand that a method is for manufacturing a bipolar transistor of an integrated circuit along a semiconductor substrate having a principal surface and includes the step of injecting, through an oxide film remaining along the principal surface, p-type impurity ions into the semiconductor substrate to make the bipolar transistor comprise a p-type region.

According to the different aspect of this invention, the above-understood method comprises the steps of increasing an oxygen content of the oxide film to turn the oxide film into a high oxygen content film, of chemically removing the high oxygen content film to make the p-type region have an exposed end, and of forming an electrode for the p-type region in ohmic contact with the exposed end.

BRIEF DESCRIPTION OF THE DRAWING

FIG. 2 show on an enlarged scale a schematic vertical section of an npn bipolar transistor of an integrated circuit at a few of various steps of manufacture in accordance with a method according to a first embodiment of the instant invention;

FIG. 3 exemplifies a distribution curve of an impurity concentration along a line 3—3 illustrated in FIG. 2;

FIG. 4 is an enlarged schematic vertical sectional view of an npn bipolar transistor of an integrated circuit at one of various steps of a method according to a second embodiment of this invention.

DESCRIPTION OF THE PREFERRED EMBODIMENTS

Referring to FIGS. 1(A) through (G), the description will begin with a conventional method of manufacturing an npn bipolar transistor as an element of an integrated circuit. This is in order to facilitate an understanding of the present invention. The bipolar transistor was manufactured on or along a semiconductor substrate having a principal surface.

Figure 1A:
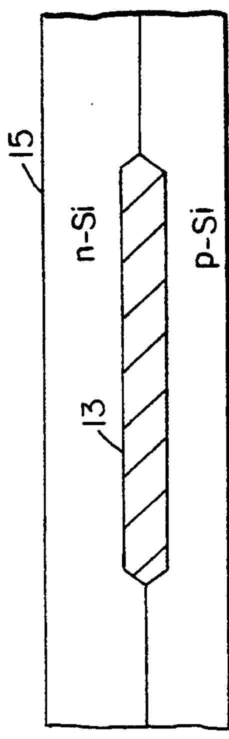
FIGS. 1(A) through (G) are schematic vertical sectional views of an npn bipolar transistor of an integrated circuit at various steps of manufacture according to a conventional method.

In FIG. 1(A), a semiconductor substrate layer 11 has a p-type conductivity and a substrate layer surface. The substrate layer is typically a p-type silicon (p-Si) layer. A highly n-doped ($n^+$-type) collector region 13 was selectively manufactured on the substrate layer surface in the manner known in the art as by thermal diffusion or by ion injection. For selective formation of such an element of the bipolar transistor, photographic etch of a photoresist or mask films and subsequent etch of an underlying layer or film was resorted to throughout a method of the type being illustrated unless otherwise specified. An n-type semiconductor epitaxial layer 15 was formed of, for example, n-type silicon (n-Si) to have an epitaxial layer surface. The collector region 13 became a buried layer. Rather than the substrate layer 11, the exitaxial layer 15 is herein referred to as the semiconductor substrate. In principle, the epitaxial layer surface serves as the principal surface.

Figure 1B:
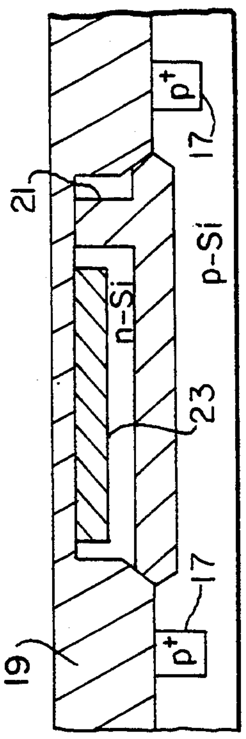

In FIG. 1(B), highly p-doped ($p^+$-type) regions 17 were selectively formed either by thermal diffustion or by ion injection. An insulator layer (not shown), such as a nitride layer, was formed on the principal surface. By thermal oxidization under a raised pressure, a field oxide layer 19 was selectively formed along the principal surface as an element isolation layer to surround on the principal surface a transistor area along which the bipolar transistor was manufactured with electrical isolation from other integrated circuit elements (not shown) formed along like areas surrounded by the field oxide layer 19. The transistor area was covered with a thin film of the field oxide layer 19.

Referring more particularly to FIG. 1(B), it is appreciated that the n-type semiconductor epitaxial layer 15 was isolated under the transistor area as an n-type junction region by the field oxide layer 19. A photoresist film for ion injection (not shown) was formed on the field oxide layer 19 including the thin film. A collector opening (not shown) was selectively formed through the photoresist film. A highly n-doped collector lead 21 was formed by ion injection of n-type impurity ions through the collector opening. A similar photoresist film (not shown) was formed. A region opening (not shown) was selectively formed. Through the region opening, a highly p-doped base region 23 was formed by slow-speed ion injection in the known manner to provide a shallow junction relative to the n-type junction region.

Figure 1C:
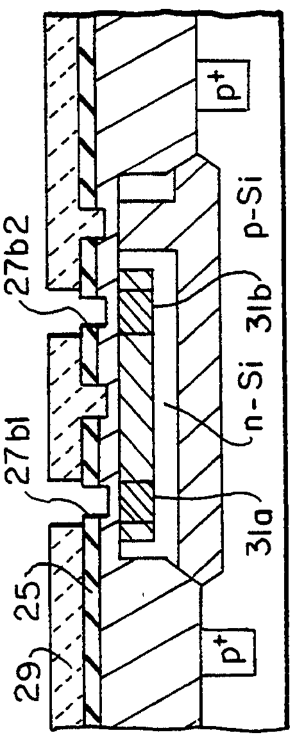

In FIG. 1(C), an insulator layer 25 was formed on the field oxide layer 19 including the thin film. The insulator layer 25 is, for example, a nitride layer. A photoresist film for etch (not shown) was formed on the insulator layer 25. Two base openings 27b1 and 27b2, a collector opening 27*c* (later depicted), and an emitter opening 27*e* (later illustrated) were selectively formed through the insulator layer 25 and partly into the thin film of the field oxide layer 19. Very thin films of the field oxide layer 19 remained in the base, the collector, and the emitter openings 27 (suffixes omitted) at their bottoms. Remaining in each of the base openings 27*b* (suffixes 1 and 2 omitted), each of the very thin films is herein referred to as a field oxide film or briefly as an oxide film.

Referring more specifically to FIG. 1(C), a photoresist film for ion injection 29 was formed on the insulator layer 25 to have an exposed photoresist film surface. By selective etch of the photoresist film 29, the base openings 27*b* were opened to reach the exposed photoresist film surface. Each of the base openings 27*b* is now called a base hole, which will be designated by the reference symbol 27*b*. Highly p-doped base contact regions 31*a* and 31*b* were formed in the base region 23 by ion injection, through the field oxide film, of ions of a p-type impurity or p-type impurity ions, such as positive boron ions or boron fluoride ions ($BF_2$). Each of the base contant regions 31 (suffixes omitted) must not be deeper than the base region 23 and should have a high impurity concentration in order to provide excellent ohmic contact with an electrode which was formed in a later step of manufacture of the bipolar transistor.

Figure 1D:
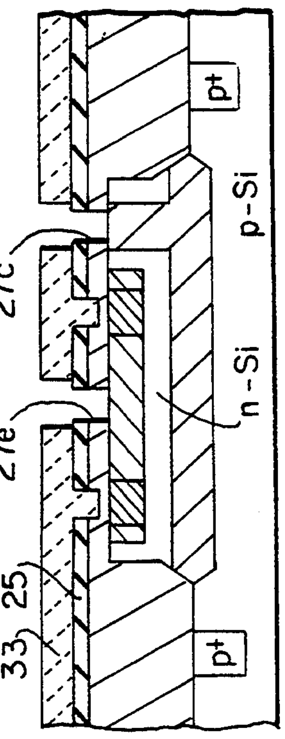
Figure 1E:
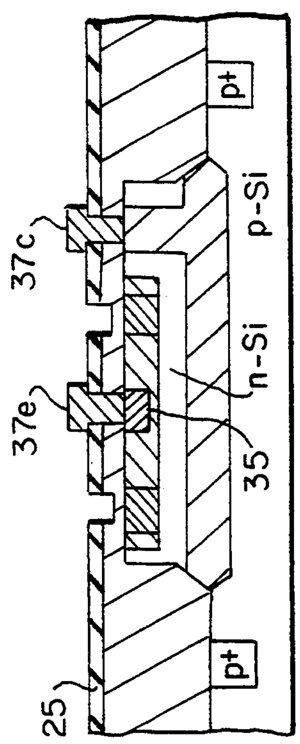

In FIG. 1(D), a mask film for etch 33 was formed on the insulator layer 25 to have an exposed mask film surface. By selective etch of the mask film 33, the collector opening and the emitter opening were opened to the exposed mask film surface as illustrated at 27*c* and 27*e*. Through these openings 27*c* and 27*e*, the very thin films of the field oxide layer 19 were selectively etched away or removed to provide a collector hole and an emitter hole, which will be designated by the reference symbols 27*c* and 27*e*.

Figure 1F:
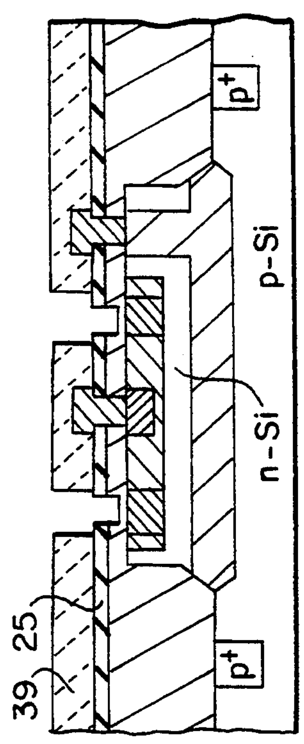

In FIG. 1(F), a polysilicon layer (not shown) was grown on the insulator layer 25 and into the base, the collector, and the emitter holes 27 (suffixes omitted as before). A highly n-doped emitter region 35 was formed by injecting n-type impurity ions, such as arsenic ions, into the base region 23 through the polysilicon layer filling the emitter hole 27*e* and by carrying out emitter drive-in diffusion under known diffusion conditions. Subsequently, the polysilicon layer was selectively etched to leave a collector polysilicon mass 37*c* and an emitter polysilicon mass 37*e* in ohmic contact with the collector lead 21 and with the emitter region 35.

In FIG. 1(F), another mask film for etch 39 was formed on the insulator layer 25 to cover the collector and the emitter polysilicon masses 37 (suffixes omitted) and was selectively etched to expose the base holes 27*b*. The field oxide films were selectively removed from the bottoms of the base holes 27*b* by chemical etch or removal, as by hydrofluoric acid.

Figure 1G:
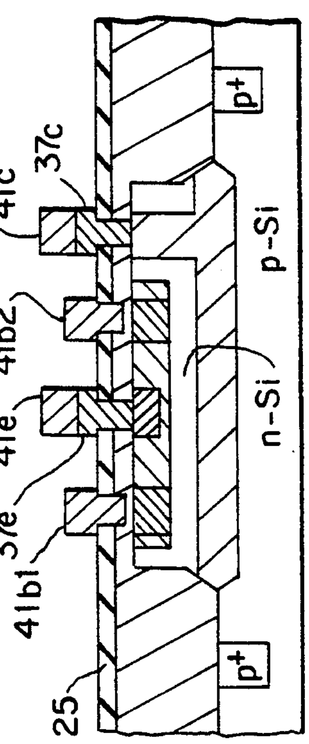

In FIG. 1(G), base electrodes 41b1 and 41b2, a collector electrode 41*c*, and an emitter electrode 41*e* were formed, as by gold or aluminium. The base electrodes 41*b* (suffixes 1 and 2 omitted) should be in ohmic contact with the base contact regions 31 through the base holes 27*b*. The collector and the emitter electrodes 41*c* and 41*e* were in ohmic contact with the collector and the emitter polysilicon masses 37 and therefore with the collector lead 21 and with the emitter region 35. The npn bipolar transistor was now complete.

Reviewing FIG. 1(F), it has been confirmed by the present inventor in the manner described hereinabove that each of the field oxide films was not completely removed from the bottoms of each of the base holes 27*b* but remained as a film of a thickness between 100 and 200 ångströms. This is because the field oxide film was highly doped with the p-type impurity to become a silicon-boron (SiB) film during the ion injection described in conjunction with FIG. 1(C). As a consequence, the base electrodes 41*b* were not brought into ohmic contact with the base contact regions 31. The bipolar transistor therefore has a forward voltage higher than 1 volt and a forward voltage gain which was from 11 to 13 dB and was not sufficiently high.

Referring now to FIGS. 2 and 3 with FIGS. 1(A) through (G) additionally referred to, an npn bipolar transistor was manufactured in accordance with a method according to a first embodiment of this invention. Similar parts are designated by like reference numerals and symbols.

In the manner described before with reference to FIGS. 1(A) through (C), the base contact regions 31 were manufactured. The collector and the emitter openings 27*c* and 27*e* were filled with downwardly extending portions of the photoresist film for ion injection 29.

In FIG. 2, this photoresist film 29 was removed although this step of removal is not explicitly described with reference to FIGS. 1(C) and (D). The very thin films of the field oxide layer 19 remained in the base, the collector, and the emitter openings 27 at their bottoms. In FIG. 2, a line 3—3 is illustrated to pass through one of the field oxide films and one of the base contact regions 31 that underlied below the field oxide film under consideration. In FIG. 3, the p-type impurity has a distribution of its concentration (conc.) along the line 3—3 in the manner exemplified by a distribution curve. The concentration was highest along an interface between the field oxide film and the underlying one of the base regions 31.

Referring again to FIG. 2, the very thin films of the field oxide layer 19 were subjected to thermal oxidization. Among the very thin films, the field oxide films were given a higher or excess oxygen content in the base openings **27*b* at their bottoms. Each oxide or silicon-boron film was thereby turned into a high oxygen content film, which was a borosilicate glass (BSG) film. The thermal oxidization should be carried out at a lower temperature and during a shorter time interval than those used in the emitter drive-in diffusion which was later carried out in the manner described in connection with FIG. 1**(E). Typically, the lower temperature is about 850° C. The shorter time interval is about 15 minutes long.

Such high oxygen content films were chemically removed together with other very thin films in the collector and the emitter openings **27*c* and 27*e*, as by hydrofluoric acid. Subsequently, the steps of manufacture were continued in the manner described with reference to FIGS. 1(E) and (G). As will later be described, it has been confirmed that the bipolar transistor comprises neither the oxide films nor the high oxygen content films between the base contact regions 31 and the base electrodes 41*b* although such films are depicted in FIGS. 1**(E) through (G).

Turning to FIG. 4 with FIGS. 1(A) through (G) continuously referred to, an npn bipolar transistor was manufactured by a method according to a second embodiment of this invention. Similar parts are designated by like reference numerals and symbols.

In the manner described with reference to FIGS. 1(A) through (C), the base contact regions 31 were manufactured. Only the base openings **27*b* were opened to the exposed surface of the photoresist film for ion injection 29 with the collector and the emitter openings 27*c* and 27*e* filled with downward extensions of the photoresist film 29**.

In FIG. 4, oxygen ions were injected into the field oxide films through the base openings **27*b*. This gave a high or excess oxygen content to the field oxide films. Like in FIG. 2**, the field oxide films were changed into high oxygen content films or the borosilicate glass films.

Subsequently, the steps of manufacture were continued in the manner described with reference to FIGS. 1(D) through (G). It has been confirmed that the field oxide films or the high oxygen content films were thoroughly removed by the chemical etch or removal described in conjunction with FIGS. 1(F).

Figure 5:
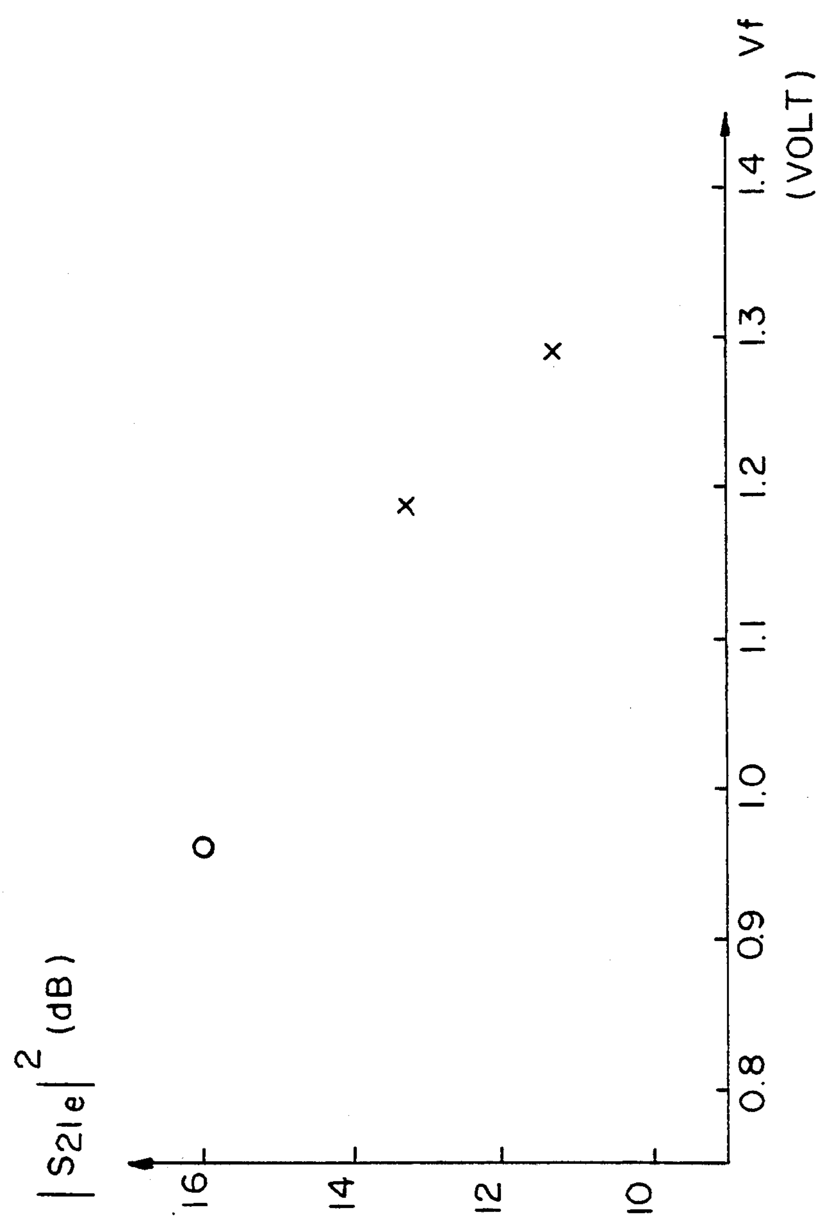
FIG. 5 shows forward voltages and forward voltage gains in connection with npn bipolar transistors manufactured in accordance with a conventional method and methods according to this invention.

Referring to FIG. 5, the forward voltage is designated by Vf and is scaled along the abscissa in volt. The forward voltage gain is designated by $|S_{21e}|^2$ as usual and is scaled along the ordinate in dB. Measured values are indicated by small crosses in connection with the npn bipolar transistors manufactured by the conventional method and are indicated by a smill circle with regard to the npn bipolar transistors manufactured by the methods illustrated with reference to FIGS. 2 and 1(A) through (G) and FIGS. 4 and 1(A) through (G).

Reviewing FIGS. 1(A) through (G), 2, and 4, the npn bipolar transistor may comprise only one of the base contact regions 31. Such a base contact region is herein called a p-type region. In the manner which will readily be understood by one skilled in the art, this invention is equally well applicable to a pnp bipolar transistor which serves as an element of an integrated circuit. In the pnp bipolar transistor, each of the emitter region 35 and the collector lead 21 is highly p-doped and herein referred to as a p-type region.

It is now understood as regards this invention that a bipolar transistor is manufactured as an element of an integrated circuit along a semiconductor substrate (15) having a principal surface. The bipolar transistor may be whichever of an npn and a pnp bipolar transistor.

The npn bipolar transistor comprises a p-type region (31) formed by injection, through a field oxide film remaining along the principal surface, of p-type impurity ions into the semiconductor substrate. The npn bipolar transistor is featured by the fact that the npn bipolar transistor comprises no field oxide film between the p-type region and an electrode (**41*b***) for the p-type region. More particularly, the p-type region has an exposed end which is excellently brought into ohmic contact with the electrode for the p-type region.

The pnp bipolar transistor comprises a p-type region (21 or 35) formed by injection, through a field oxide film remaining along the principal surface, of p-type impurity ions into the semiconductor substrate. The pnp bipolar transistor is characterised by the fact that the pnp bipolar transistor comprises no field oxide film between the p-type region and an electrode (**41*c* or 41*e***) for the p-type region. The p-type region is brought into excellent ohmic contact with its electrode.

It is possible to manufacture whichever of the npn and the pnp bipolar transistors as an element of an integrated circuit by a method illustrated with reference to FIGS. 2 and 1(A) through (G). The method may be that illustrated with reference to FIG. 4 and 1(A) through (G).

What is claimed is:

1. A method of manufacturing a bipolar transistor of an integrated circuit along a semiconductor substrate having a principal surface, said method including the step of injecting, through an oxide film remaining along said principal surface, p-type impurity ions selected from a group consisting of boron and boron fluoride into said semiconductor substrate to make said bipolar transistor comprise a highly p-doped base contact region with a peak of dopant profile at an interface of said semiconductor substrate and said oxide film, said interface of said oxide film being changed into a film of a compound consisting essentially of silicon and said p-type impurity, wherein said method comprises the steps of increasing an oxygen content of said oxide film to turn said oxide film into a high oxygen content film and turn said film of a compound into a borosilicate glass film, of chemically removing said high oxygen content film and said borosilicate glass film completely to make said highly p-doped base contact region have an exposed end, and of forming an electrode for said highly p-doped base contact region in ohmic contact with said exposed end.

2. A method as claimed in claim 1, wherein said oxygen content increasing step comprises the step of subjecting said oxide film to thermal oxdization.

3. A method as claimed in claim 1, wherein said oxygen content increasing step comprises the step of injecting oxygen ions into said oxide film.

4. A method of manufacturing a bipolar transistor of an integrated circuit along a silicon substrate having a principal surface, said method including steps of forming a base region into a collector region, of injecting p-type impurity ions selected from a group consisting of boron ions and boron fluoride ions into said semiconductor substrate through a field oxide film remaining along said principal surface to make a highly p-doped base contact region beside a silicon-boron film, wherein said method comprises the steps of:

increasing an oxygen content of said oxide film and said silicon-boron film to turn said oxide film into a high oxygen content film and borosilicate glass film;

chemically removing said high oxygen content film and borosilicate glass film to expose said highly p-doped base contact region; and forming an electrode for said base region in ohmic contact with said highly p-doped base contact region.

5. The method of claim 4 wherein said silicon-boron film is formed by subjecting said oxide film to thermal oxidization.

6. The method of claim 5 wherein said thermal oxidization has a temperature of about 850° C. and a duration of about 15 minutes.

7. The method of claim 4 wherein said silicon-boron film is formed by injecting oxygen ions into said oxide film.

8. The method of claim 4 wherein said highly p-doped base contact region has a highest concentration along an interface between said field oxide film and said base region.

9. A method of manufacturing a bipolar transistor comprising:

forming an n-type collector region in a silicon substrate;

forming a p-type base region into said collector region;

injecting boron ions or boron fluoride ions into said base region through a field oxide film formed on said base region to make a highly p-doped base contact region, thereby turning said field oxide film in contact with said base contact region into a silicon-boron film;

increasing an oxygen content of said silicon-boron film to turn said silicon-boron film into a borosilicate glass film, chemically removing said oxide film and said borosilicate glass film to expose said highly p-doped base contact region; and forming an electrode for said base region in ohmic contact with said highly p-doped base contact region.

* * * * *